United States Patent [19]
Belcher

[11] Patent Number: 5,466,331
[45] Date of Patent: Nov. 14, 1995

[54] ELEVATED THIN FILM FOR CERAMIC MATERIALS

[75] Inventor: James F. Belcher, Plano, Tex.

[73] Assignee: Texas Instruments Incorporated, Dallas, Tex.

[21] Appl. No.: 222,144

[22] Filed: Apr. 4, 1994

[51] Int. Cl.[6] .............................. B44C 1/22; C03C 15/00
[52] U.S. Cl. .............................. 216/17; 216/52; 216/19; 216/20; 216/65; 216/48; 216/49; 216/76; 216/80
[58] Field of Search ..................... 156/644, 648, 156/651, 654, 659.1, 663, 667, 661.1, 630, 633; 437/3, 226, 86, 974

[56] References Cited

U.S. PATENT DOCUMENTS

| | | | |
|---|---|---|---|
| 4,080,532 | 3/1978 | Hopper | 250/332 |
| 4,593,456 | 6/1986 | Cheung | 437/3 |
| 4,740,700 | 4/1988 | Shaham et al. | 437/3 X |
| 4,745,278 | 5/1988 | Hanson | 250/338.2 |
| 4,792,681 | 12/1988 | Hanson | 250/338.2 |
| 4,927,771 | 5/1990 | Ferrett | 437/3 |

OTHER PUBLICATIONS

D. J. Warner, D. J. Pedder, J. S. Moody, and J. Burrage, "The Preparation and Performance of Reticulated Targets for the Pyroelectric Vidicon", *Ferroelectrics*, 33, 981, pp. 249–253.

R. Watton, F. Ainger, S. Porter, D. Pedder and J. Gooding, "Technologies and Performance for Linear and Two Dimensional Pyroelectric Arrays", SPIE vol. 510, Infrared Technology X, 1984, pp. 139–149.

T. D. Flaim, G. A. Barner, and T. Brewer, "A Novel Release Layer syster for IC Processing", Brewer Science, Inc. Rolla, Missouri, presented at KTI IF Conference, Nov., 1989.

C. Hanson, H. Beratan, R. Owen, and K. Sweetser, "Low–Cost Uncooled Focal Plane Array Technology", Texas Instruments Incorporated, DSEG, presented at IRIS Specialty Group on Infrared Detectors, Bedford, Mass., Jul. 1993.

C. Hansen, "Uncooled Thermal Imaging at Texas Instruments", SPIE 1993, International Symposium on Optics, Imaging and Instrumentation, Infared Technology, XIX, San Diego, Jul. 14, 1993.

H. Kaufman, R. Robinson, W. Hughes, "Characteristics, Capabilities, and Applications of Broad–Beam Sources", Commonwealth Scientific Corporation, Alexandria, Virginia, 1987.

R. Watton, "Ferroelectrics for Infrared Detection and Imaging", *ISAF '86, Proceedings of the Sixth IEEE International Symposium on Applications of Ferroelectrics*, Jun. 1986.

*Primary Examiner*—William Powell
*Attorney, Agent, or Firm*—Brian A. Carlson; James C. Kesterson; Richard L. Donaldson

[57] ABSTRACT

A novel reticulated array comprises islands of ceramic (e.g. BST 20) which are fabricated from novel materials using unique methods of patterning. Trenches (22) are formed in the ceramic substrate from the front side and filled with a filler material (e.g. parylene 24). An elevation layer (e.g. polyimide 26) is deposited above the filler material, and a front side optical coating (e.g. transparent metal layer 34, transparent organic layer 36 and conductive metallic layer 38) is elevated above the substrate between the ceramic islands. The elevation layer provides added protection to the optical coating during filler material removal. The substrate is thinned from the back side down through a portion of the trench filler material. Novel fabrication methods also provide for the convenient electrical and mechanical bonding of each of the massive number of ceramic islands to a signal processor substrate (e.g. Si 62) containing a massive array of sensing circuits.

23 Claims, 4 Drawing Sheets

ELEVATED THIN FILM FOR CERAMIC MATERIALS

CROSS-REFERENCES TO RELATED APPLICATIONS

The following related applications were filed concurrently with the instant application on Apr. 4, 1994:

| Title | Inventors | Serial Number/ Filing Status |
|---|---|---|
| Dual Etching of Ceramic Materials | Owen, Belcher | 08/223,087, pending |
| Etching of Ceramic Materials with an Elevated Thin Film | Belcher, Owen | 08/223,073, pending |
| Dual Etching of Ceramic Materials with an Elevated Thin Film | Belcher, Owen | 08/223,088, pending |
| Dual Etching of Ceramic Materials with a Thin Front Film | Belcher, Owen | 08/222,769, pending |
| Multiple Level Mask for Patterning of Ceramic Materials | Belcher, Frank, Jones, Long | 08/222,146, pending |

FIELD OF INVENTION

This invention generally relates to uncooled infrared (IR) detector arrays and means of fabrication.

BACKGROUND OF INVENTION

The novel IR devices and fabrication processes to be described are related to the types of IR detector arrays recorded in (1) U.S. Pat. No. 4,080,532, Hopper, March, 1978; (2) U.S. Pat. No. 4,745,278, Hanson, May, 1988; (3) U.S. Pat. No. 4,792,681, Hanson, December, 1988; and (4) "LOW-COST UNCOOLED FOCAL PLANE ARRAY TECHNOLOGY", by Hanson, Beratan, Owen and Sweetser, presented Aug. 17, 1993 at the IRIS Detector Specialty Review.

The physical requirements of uncooled arrays and a brief description of current fabrication processes will be presented to aid in the understanding of the improvements realized by the novel methods to be described.

An area imager may contain several hundred to tens of thousand individual picture elements (pixels). Each of these pixels consists of a capacitor (or resistor or another type of electronic element) that has a heat (IR intensity) sensitivity. Making use of the fact that the charge stored by a capacitor is proportional to the product of its terminal voltage and its capacitance, electronic circuitry can be attached to the two terminals of the pixel capacitor to measure the intensity of the IR impinging on a specific pixel. Obstructions in the imaging field are removed and the electronic connections to these capacitors are simplified if one of the capacitor terminals is made common to all. Hundreds to tens of thousands of connections must still be made between the other isolated terminals of the capacitors and the electronic sensing circuitry. In addition, the capacitor based pixel should be thermally isolated from each other while having one terminal connected to all the other common terminals.

The common connection to one side of the pixel capacitors consists of a front side thin film referred to as the optical coating. This may be a composite of a plurality of thin films which have been optimized with regard to IR absorbency, IR transparency, electrical conductivity, thermal resitivity, etc.. The thicker heat sensitive dielectric substrate in this case can be barium-strontium-titanate (BST) which is a ceramic perovskite material.

SUMMARY OF THE INVENTION

To leave the front side optical coating thin film electrically conducting while isolating the pixels thermally, one may etch deep trenches around the pixel capacitors in the BST substrate. The optical coating side of the device will be referred to as the front side. The implementation of a thermal isolation process without damage to this thin optical coating can be difficult.

A preferred embodiment of this invention comprises a novel reticulated array of two-terminal heat sensitive capacitors which are fabricated from novel materials using unique methods of patterning. The isolation of the pixel capacitors of an uncooled IR array is performed from the front side by etching the ceramic (e.g. BST) substrate to form deep trenches around the pixels. These trenches are filled with an organic and the front surface of the substrate is planarized by mechanical polishing. A fragile optical coating is deposited directly on the planarized surface. The substrate is thinned from the back side down through a portion of the trench filled with the organic.

Some organics can be difficult to remove in some applications. Plasma processing is one method but when this plasma etching contacts the optical coating, damage may result. Adding additional material above the organic and beneath the optical coating gives added protection for this process step and elevates the optical coating over the trenches.

The material used to elevate the coating can be an organic, such as polyimide release layer, "PIRL", a trademark of Brewer Science, Inc. The elevation layer may also be a multiple coating of an easy to remove organic such as "PIRL" or standard photoresist over a suitable metal conductor such as titanium-tungsten (TiW).

The novel fabrication method also provides for the convenient electrical and mechanical bonding of each of the massive number of pixel capacitors to an integrated circuit containing a massive array of sensing circuits.

One embodiment of the present invention is a microelectronic structure comprising a substantially undamaged continuous optical coating layer, a reticulated array of ceramic islands disposed on the optical coating layer, and thin electrical contacts disposed on a surface of the ceramic islands opposite the optical coating layer. The optical coating layer comprises elevated portions between and partially overlapping the ceramic islands, whereby the elevated portions of the optical coating layer can provide improved thermal efficiency for sensing impinging infrared radiation. In another embodiment the ceramic islands comprise a first cross-sectional area proximate the optical coating layer which is smaller than a second cross-sectional area proximate the electrical contacts.

A method of forming an embodiment of the present invention comprises providing a ceramic substrate having a front side and a back side, forming trenches having a depth and a first predetermined pattern on the front side of the ceramic substrate, filling the trenches with a filler material, and forming an elevation layer having a second predetermined pattern on the front side of the substrate. The elevation layer is substantially aligned with the trenches and covers at least the filler material in the trenches. The method further comprises depositing a thin front layer on the front side of the substrate and on the elevation layer, thereby forming elevated portions of the thin front layer above the front side. The method further comprises thinning the ceramic substrate by mechanically polishing the back side of the ceramic substrate to a thickness less than the depth of the trenches, removing the filler material from the trenches, and removing the elevation layer, thereby forming isolated islands of the ceramic substrate connected by the thin front layer. The thin front layer remains substantially undamaged, having not been exposed to the process removing the filler material.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Some of the preferred embodiments will be presented with reference to FIGS. 1–14 and Tables 1 and 2. It should be understood that the drawings are for illustrative purposes and are not to dimensional or relative scale. In addition, only a few detectors are illustrated in the figures, but the present invention can be applied to any number of detectors in various configurations (e.g. single line or array).

One of the preferred embodiments uses a patterned organic coating to elevate the optical coating and another preferred embodiment uses a combination of a metal layer with an organic layer.

Table 1, below, provides an overview of some embodiments and the drawings.

TABLE 1

| ID# | Description | Material (dim) | Alternates |
|---|---|---|---|
| 20 | Substrate | BST 0.06 cm | 0.01–0.25 cm |
| 22 | Thermal isolation trenches | | |
| 24 | Organic filler | Parylene | Photoresist, polyimide, epoxy, "PIRL" |
| 26 | Elevation layer | "PIRL" 8–10 μm | 0.1–20 μm other organics (e.g. photoresist, polyimide, parylene, epoxy) |
| 28 | Mask for elevating coating | Photoresist 1.5 μm | 0–5 μm other masking materials |
| 32 | Optical coating | 3 layered | ¼ IR wavelength |
| 34 | Transparent coat | NiCr 50 Å | 25–100 Å other metals or metal compounds |
| 36 | ¼ wavelength separator coat | Parylene 1.4 μm | ¼ desired IR wavelength other organics (e.g. photoresist, polyimide, epoxy) |
| 38 | Electrical conducting coat | NiCr 1000 Å | 500–2000 Å other metals or metal compounds |
| 39 | Thinned Substrate | BST 18 μm | 1–200 μm |
| 40 | Mechanical carrier | Glass | Silicon, quartz, ceramic |
| 42 | Adhesive | Wax 0–10 μm | Epoxy |

Figure 1:
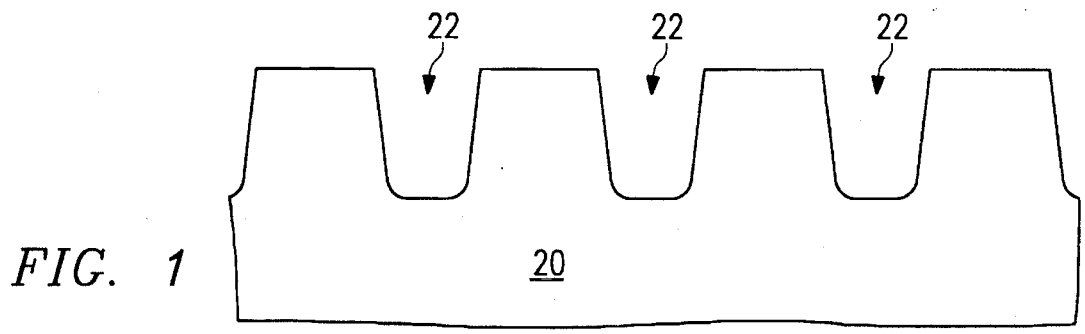
FIG. 1 illustrates the cross section of the BST substrate after patterning of the thermal isolation trenches.

A method of performing the thermal isolation of pixels is by laser vaporization of deep trenches around the pixel on the front surface of the BST substrate. The results of this process is shown in FIG. 1 where 20 is the BST substrate and 22 are the trenches created. Laser removal of the BST is followed by an etch to remove any remaining slag and a high temperature anneal in an oxygen ambient to restore the desired electrical properties that have been damaged by the high temperatures of laser vaporization.

Figure 2:
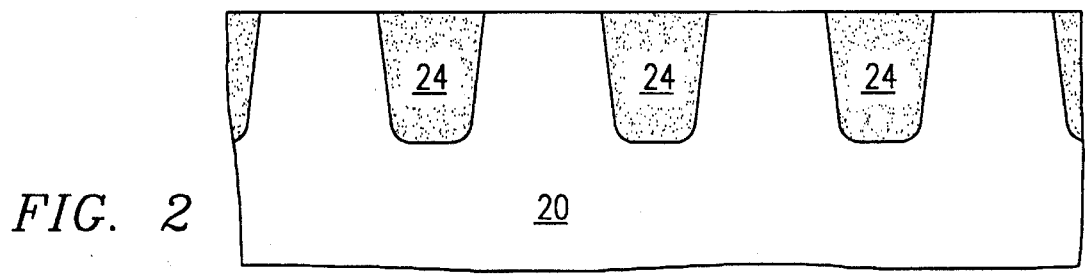
FIG. 2 illustrates the trenches filled with an organic after having been mechanically polished.

The trenches are now filled with an organic substance such as parylene 24 and the front surface is planarized by mechanical polishing as shown in FIG. 2.

Figure 3:
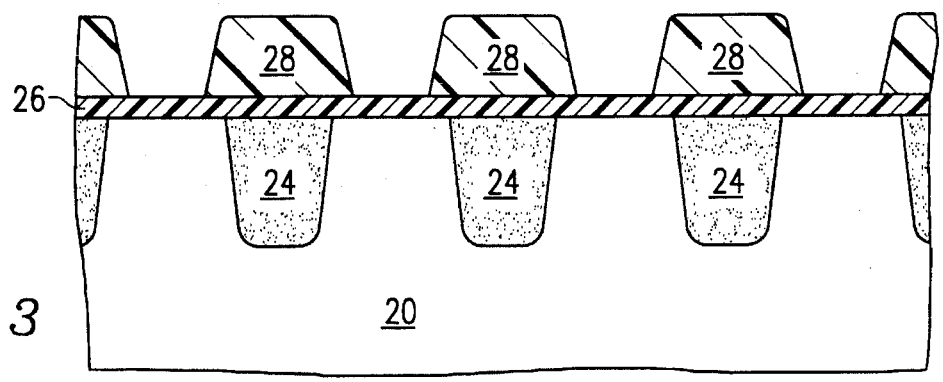
FIG. 3 illustrates the addition of an organic material on the front side of the substrate and patterned photoresist over it.
Figure 4:
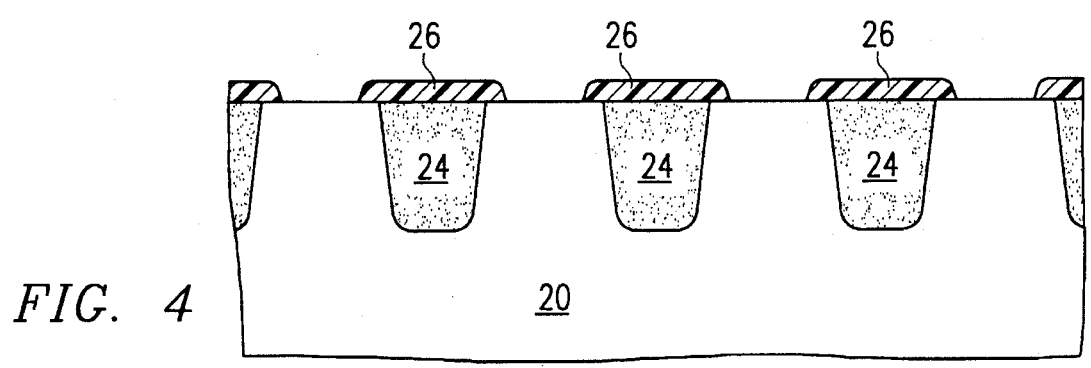
FIG. 4 shows a grid of an organic coating that has been patterned over the trench filling organic.

An organic coating 26 such as Brewer Science Inc's Polyimide Release Layer ("PIRL") is applied to the front side and patterned by conventional photolithography using photoresist 28 as shown in FIGS. 3 and 4. The photoresist 28 is removed leaving the organic grid 26 that is aligned above the trench filling parylene 24.

Figure 5:
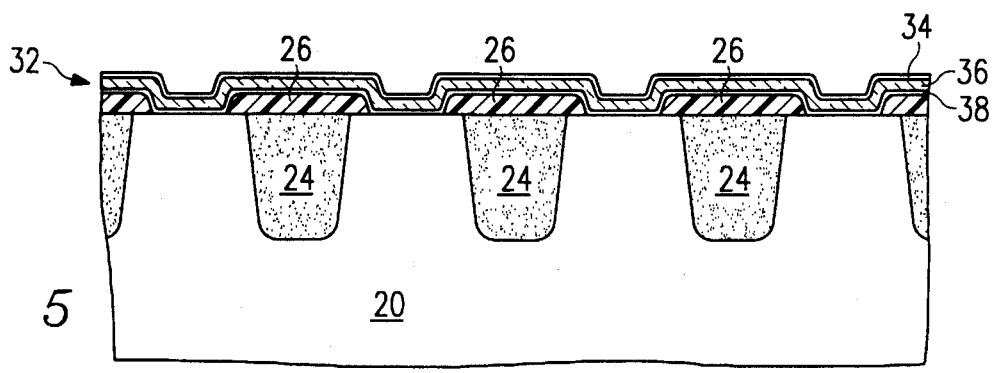
FIG. 5 shows the optical coating applied to the front side of the substrate.

The optical coating 32 is applied over the entire front surface topography as shown in FIG. 5. This optical coating 32 serves multiple functions. There are three layers of materials. The top layer 34 is a very thin, typically 50 Å (angstroms), semitransparent metal such as nichrome (NiCr). The middle layer 36 is transparent but has a thickness and optical index such that an odd multiple of a quarter wavelength of the desired IR wavelength separates the top and bottom surfaces of the two metal layers. The material used for this middle layer separator 36 can be parylene also. The bottom layer 38 of the optical coating 32 serves as the main electrical conductor and heat transmitter to the underlying BST pixel 20. NiCr of about 1,000 A can be used for layer 38. These three layers make an optical wavelength filter to trap more IR energy at the desired wavelength.

Figure 6:
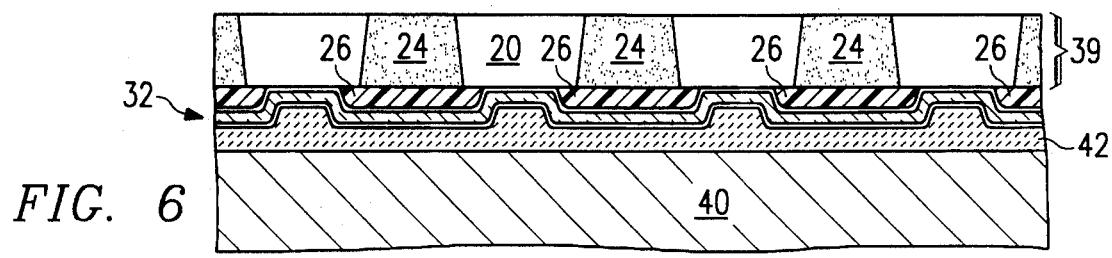
FIG. 6 shows the BST substrate mounted face down on a carrier after thinning from the back side by mechanical means.

These composite materials may now be physically mounted to a fixture 40 by an adhesive 42 such as wax to mechanically polish and thin the BST 20 to a thickness 39 from the back side down to and slightly through the parylene 24 filling the thermal isolation trenches 22 as shown in FIG. 6.

Table 2, below, provides an overview of some embodiments and the drawings.

TABLE 2

| ID# | Description | Material (dim) | Alternates |
|---|---|---|---|
| 44 | Metal lift-off layer | Photoresist | |
| 46 | Backside electrical contact | Bonding Alloys | 4 layer composite of |
| 48 | | In 3 μm | 0.15–6 μm |
| 50 | | Au 0.1 μm | 0.05–0.15 μm |
| 52 | | NiCr 0.05 μm | 0.05–0.15 μm |
| 54 | | TiW 0.05 μm | 0.02–0.10 μm |
| 56 | IC Contact mesa | Polyimide 12 μm | 1–30 μm photoresist, parylene, epoxy |
| 58 | Ohmic connection | TiW 2000 Å | 100–10,000 Å other metals, conductors |
| 60 | IC via | | |
| 62 | IC processor | Si or GaAs | |
| 64 | Continuous metal layer | TiW 1000 Å | 500–5000 Å In or other suitable metal |

Figure 7:
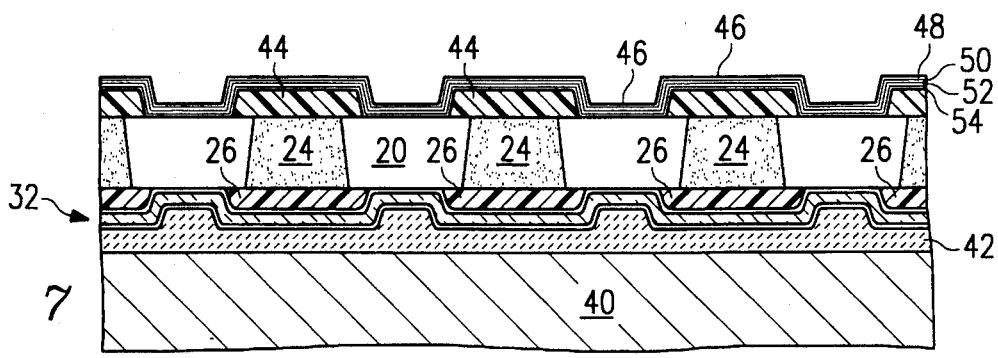
FIG. 7 shows the device after coating the back side with photoresist which has been patterned to lift off the deposited contact metal over the organic trench filler.

The back side metal 44 is patterned by a conventional photoresist lift off process as shown in FIG. 7. Photoresist 44 is deposited and patterned on the back side in a standard manner being careful to align the pattern of the resist 44 to expose the BST surface 20 underneath and cover the trench filling parylene 24. The contact metal 46 is deposited over this patterned photoresist. The metallization 46 does not coat the vertical walls of the photoresist 44 with enough thickness to survive the stripping of the photoresist 44. Alternatively, a standard metal deposition and etch process can be used instead of the lift-off process.

Although the composition of 46 is not extremely critical, 46 serves as one side of the pixel capacitor and forms the metallic surfaces to which the complex IC sensing circuits will be mechanically and electrically bonded. The compositions and thicknesses used for 46 are shown in Table 2. From the outside toward the substrate 24 the layers are indium (In) 48, gold (Au) 50, NiCr 52 and TiW 54.

Figure 8:
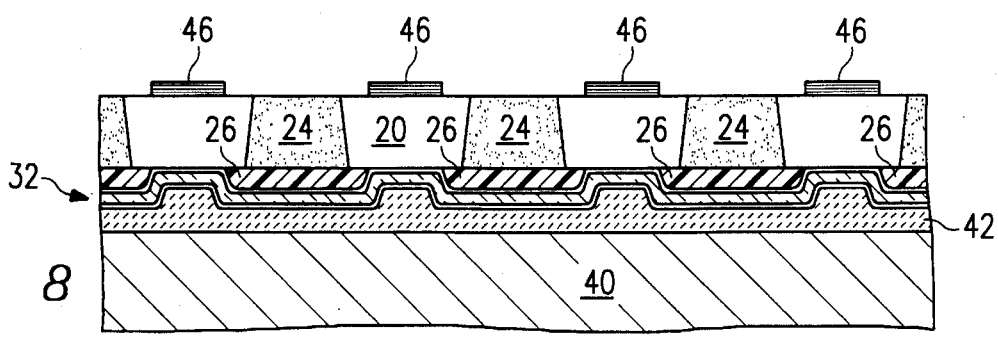
FIG. 8 shows the results of lifting off the undesired contact metal and removing the photoresist.
Figure 9:
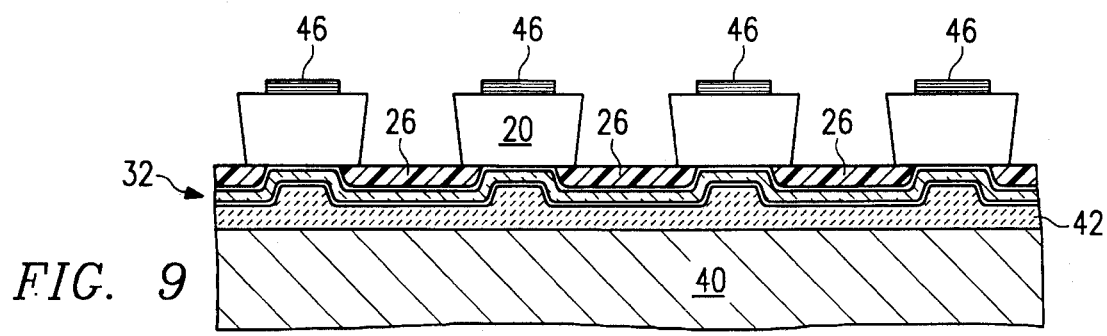
FIG. 9 illustrates the device after the organic trench filler has been removed by plasma means leaving the organic elevation layer mostly intact to protect the optical coating.

After the resist 44 and the undesired metal 46 have been cleaned from the substrate, the trench filling parylene 24 is still in place as shown in FIG. 8. A plasma etch process is used to etch the parylene and partially etch the "PIRL" grid 26 as shown in FIG. 9.

Figure 10:
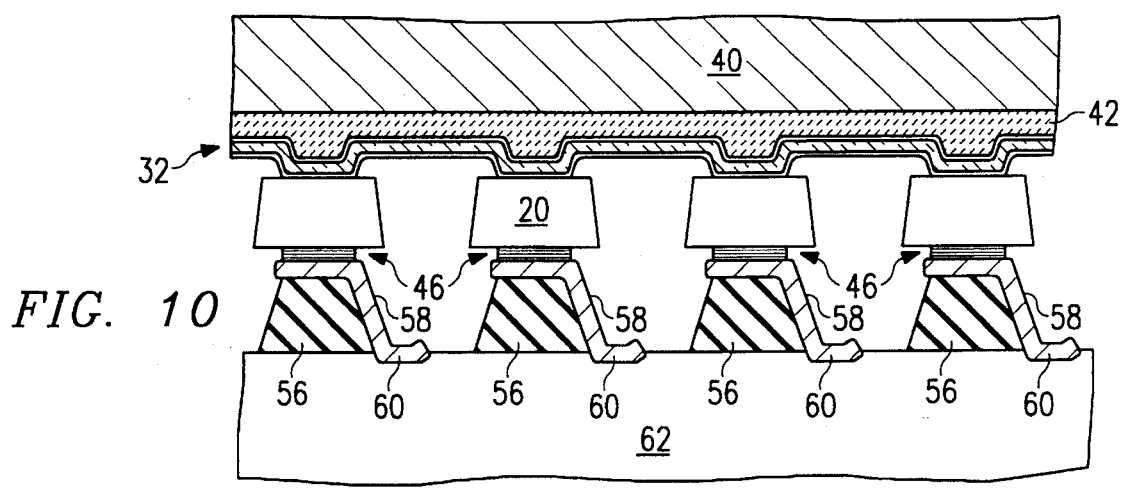
FIG. 10 shows the ensemble after the organic elevating medium has been removed by a suitable solvent. The carrier is used as a means of supporting the fragile IR sensor array while it is bonded to the planar IC containing the electronic sensing circuitry.

FIG. 10 shows that unwanted materials have been removed to leave the thermal isolation trenches surrounding the substrate pixels 20. The optical coating is protected from damage during this process by the organic layer 26 which is elevating the optical coating 32. The organic layer 26 may be removed with a suitable solvent or a dry etch. If 26 is photoresist, conventional solvents and developers may be used. If 26 is "PIRL", Brewer Science solvents may be used.

As shown in FIG. 10, the same mechanical carder 40 is now used to support the fragile IR detector assembly and align the BST 20 mesas with IC mesas 56 such that a bonding material 58 makes electrical connections between each of the pixels by the pixel metallization layer 46 and the processing IC 62 via connection 60.

This completes the description of one of the preferred embodiments but another preferred embodiment uses two materials to elevate the optical layer. Because most of the patterning processes are identical to those just described only figures showing the key differences will be described with the aid of FIG. 11–14.

Figure 11:
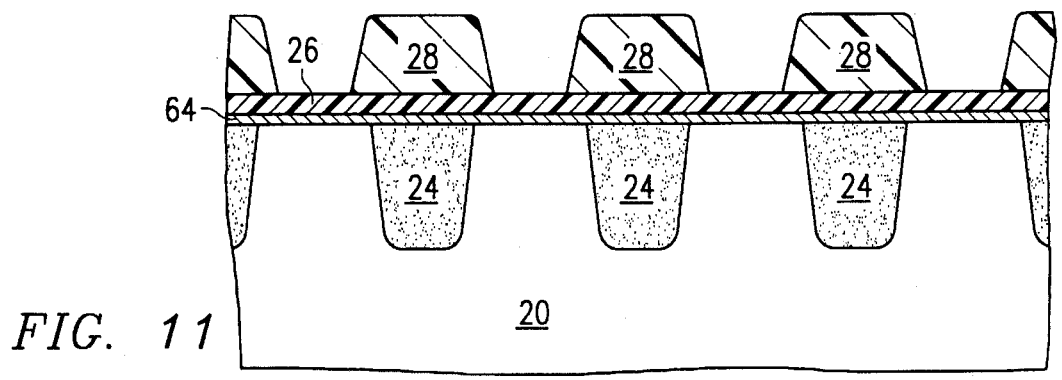
FIG. 11 shows patterning similar to that depicted in FIG. 3 except in this case a metal layer is deposited on the substrate prior to the organic coating.
Figure 12:
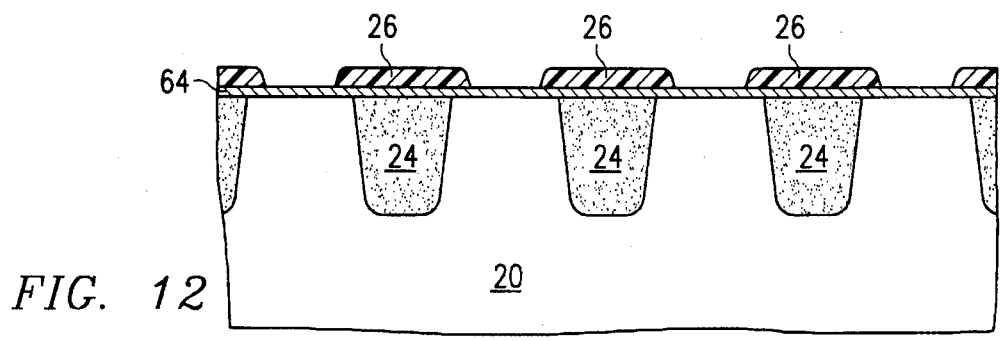
FIG. 12 indicates that the metal remains in place as the organic layer is patterned and the resist removed as in FIG. 4.

The laser vaporization of the substrate to delineate thermal isolation trenches, filling these trenches with parylene and mechanically polishing the front side of the substrate proceed as previously described as shown in FIGS. 1 and 2. After the front side has been polished to a planar surface, a metal such as TiW 64 is deposited as shown in FIG. 11. The organic coating 26 is deposited over this metal and is patterned by conventional photolithography as shown in FIGS. 11 and 12. These two figures are analogous to FIGS. 3 and 4. The metal 64 remains unpatterned.

Figure 13:
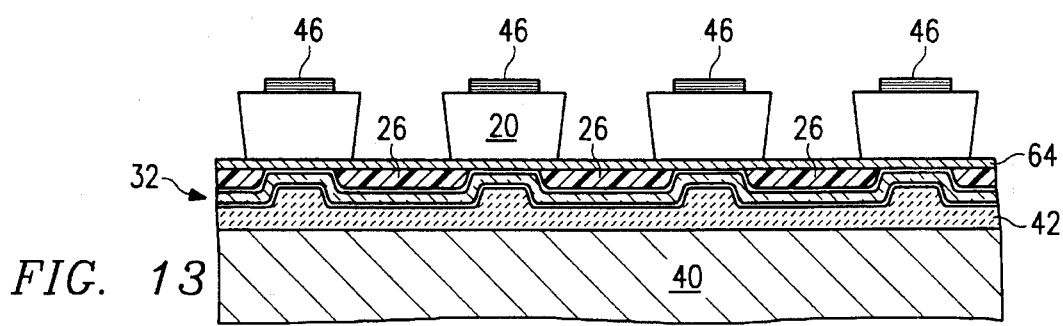
FIG. 13 shows that the front side metal has remained in place to give additional protection to the optical coating (similar to FIG. 9)

The processing proceeds as previously described until the trench filling parylene is removed. FIG. 13 is analogous to FIG. 9 except the metal 64 adds additional protection during the parylene removal. Without any further resist added, the exposed metal 64 may be plasma etched preferentially with respect to the underlying organic 26. This leaves metal 64 on the front side of the BST 20 pixel as a full face electrode. The organic 26 may now be removed with a suitable solvent or a dry etch as previously described.

Figure 14:
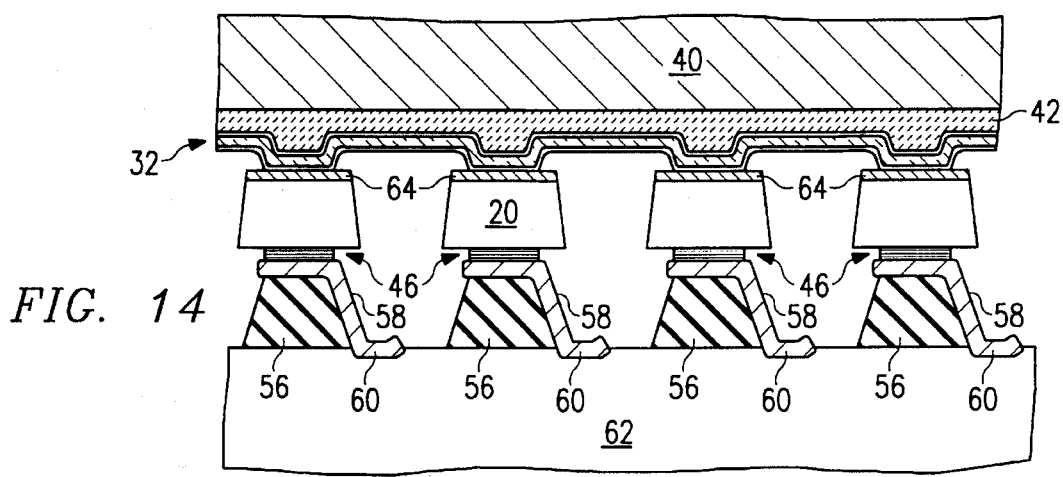
FIG. 14 illustrates, analogous to FIG. 10, the sensing array bonded to the sensing amplifier IC.

This leaves the finished structure as previously shown in FIG. 10 except for metal 64 covering the front side of the pixel for a full face contact as shown in FIG. 14. This full face contact can improve the electrical properties for some applications.

The combined optical and metal coatings are in direct contact with the BST pixel making in a sense a pixel heat sink. Any heat energy in the optical coating flows to the nearest pixel. Even though the optical surface is not planar, the optical imaging is actually superior to a planarized optical coating for some applications. This is due in part to the longer thermal path between pixels along the elevated optical coat. This is also due in part to the ease with which any supporting materials may be completely removed to improve thermal isolation without damage to the optical coating.

By the described novel methods is produced a unique, rugged reticulated array of IR sensing pixels. While this invention has been described with reference to illustrative embodiments, this description is not intended to be construed in a limiting sense. There are many variants and combinations of the materials and dimensions shown in these embodiments partially listed in Table 1 and Table 2. Almost any conductive material can be used for 64 as a continuous electrode. Above 64, the elevating layer may now be many different organic or inorganic combinations since the metal prohibits the attack of this layer. The elevation layer can be many various materials such as but not limited to photoresist, oxide (e.g. $SiO_2$), polyimide, parylene, polyamide, epoxy, nitride (e.g. $Si_3N_4$), "PIRL", and combinations thereof.

Deposition and removal may vary but the functionality is the same. The organics may be plasma etched using different gas mixtures, or may be removed with liquid solvents or by plasma ashing means. The optical coating both in contact with and elevated above the substrate can vary drastically in thickness and geometry without materially affecting the functions performed. In the dry removal of materials, reactive ion etching, plasma etching and electron cyclotron resonance plasma etching may often be interchanged without serious effect on the fabrication process. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising steps:
    (a) providing a ceramic substrate having a front side and a back side;
    (b) forming trenches having a depth and a first pattern on said front side of said ceramic substrate;
    (c) filling said trenches with a filler material;
    (d) forming an elevation layer having a second pattern on said front side of said substrate, said elevation layer substantially aligned with said trenches and covering at least said filler material in said trenches;
    (e) depositing a thin front layer on said front side of said substrate and on said elevation layer, thereby forming elevated portions of said thin front layer above said front side;
    (f) thinning said ceramic substrate by mechanically polishing said back side of said ceramic substrate to a thickness less than said depth of said trenches;
    (g) removing said filler material from said trenches; and
    (h) removing said elevation layer, thereby forming isolated islands of said ceramic substrate connected by said thin front layer, whereby the thin front layer remains substantially undamaged, having not been exposed to the removing process of step (g).

2. The method according to claim 1, wherein said ceramic substrate is barium strontium titanate.

3. The method according to claim 1, said step (b) further comprising laser vaporization.

4. The method according to claim 3, said step (b) further comprising:
    surface etching said front side of said ceramic substrate and annealing said ceramic substrate in a oxygen ambient after said laser vaporization.

5. The method according to claim 1, said step (c) further comprising:
    planarizing said filler material and said front side of said substrate after said filling of said trenches.

6. The method according to claim 1, wherein said filler material is selected from the group consisting of: photoresist, oxide, polyimide, parylene, epoxy, and nitride.

7. The method according to claim 1, said method further comprising depositing a protective metal layer on said front side of said ceramic substrate and on said filler material before said step of forming said elevation layer.

8. The method according to claim 7, wherein said protective metal layer is TiW.

9. The method according to claim 1, said step (d) further comprising:
    depositing a first organic layer on said front side of said substrate;
    forming a first mask layer on said first organic layer;
    etching said first organic layer to form said elevation layer having said second pattern; and
    removing said first mask layer.

10. The method according to claim 9, wherein said first mask layer is photoresist.

11. The method according to claim 1, wherein said elevation layer is a different material than said filler material, and said elevation layer is selected from the group consisting of: photoresist, parylene, and polyimide.

12. The method according to claim 1, wherein said thin front layer comprises multiple layers, and said step of depositing said thin front layer further comprises:
    depositing a conductive metallic layer on said front side of said substrate and on said elevation layer;
    depositing a transparent organic layer on said conductive metallic layer; and
    depositing a thin transparent metal layer on said transparent organic layer.

13. The method according to claim 12, wherein said conductive metallic layer is NiCr, said transparent organic layer is parylene, and said thin transparent metal layer is NiCr.

14. The method according to claim 1, wherein a top surface of said thin front layer opposite said ceramic substrate is mounted to a removable carrier after said step of depositing said thin front layer, wherein said carrier provides mechanical support for subsequent process steps.

15. The method according to claim 1, said method further comprising forming thin electrical contacts on said back side of said ceramic substrate after said step of thinning said ceramic substrate.

16. The method according to claim 15, wherein said islands form infrared sensitive capacitors.

17. The method according to claim 15, wherein said thin electrical contacts comprise two or more layers, and comprise indium.

18. The method according to claim 15, said step of forming thin electrical contacts further comprising:
    forming a second mask layer on said back side of said substrate, said second mask layer substantially aligned with said filler material in said trenches;
    depositing an electrical contact layer on said back side of said substrate and on said second mask layer; and
    lifting off said second mask layer to remove a portion of said electrical contact layer on said second mask layer.

19. The method according to claim 18, wherein said second mask layer is photoresist.

20. The method according to claim 1, wherein said elevation layer is removed with a wet solvent or a dry etch.

21. The method according to claim 1, wherein said islands of said ceramic substrate form a reticulated array.

22. The method according to claim 21, wherein said microelectronic structure is an infrared radiation detector.

23. The method according to claim 1, said method further comprising bump bonding said back side of said ceramic substrate to a signal processing substrate after said step of removing said elevation layer.

* * * * *